(12) United States Patent
Favre et al.

(10) Patent No.: US 10,332,828 B2
(45) Date of Patent: Jun. 25, 2019

(54) SEMICONDUCTOR POWER DEVICE COMPRISING ADDITIONAL TRACKS AND METHOD OF MANUFACTURING THE SEMICONDUCTOR POWER DEVICE

(71) Applicants: agile POWER SWITCH 3D—INTEGRATION aPSI3D, Tarbes (FR); IRT SAINT EXUPERY (AESE), Toulouse (FR)

(72) Inventors: Jacques Pierre Henri Favre, Toulouse (FR); Jean-Michel Francis Reynes, Gaillac (FR); Raphaël Riva, Ger (FR); Bernard José Charles Du Trieu De Terdonck, Castanet-Tolosan (FR)

(73) Assignees: AGILE POWER SWITCH 3D—INTEGRATION APSI3D, Tarbes (FR); IRT SAINT EXUPERY (AESE), Toulouse (FR)

( * ) Notice: Subject to any disclaimer, the term of this patent is extended or adjusted under 35 U.S.C. 154(b) by 0 days.

(21) Appl. No.: 15/765,116

(22) PCT Filed: Sep. 30, 2015

(86) PCT No.: PCT/EP2015/072540
§ 371 (c)(1),
(2) Date: Mar. 30, 2018

(87) PCT Pub. No.: WO2017/054855
PCT Pub. Date: Apr. 6, 2017

(65) Prior Publication Data
US 2018/0277475 A1 Sep. 27, 2018

(51) Int. Cl.
*H01L 23/48* (2006.01)
*H01L 23/498* (2006.01)
(Continued)

(52) U.S. Cl.
CPC .. *H01L 23/49844* (2013.01); *H01L 23/49822* (2013.01); *H01L 23/49833* (2013.01);
(Continued)

(58) Field of Classification Search
CPC ......... H01L 23/49833; H01L 23/49822; H01L 23/49844; H01L 25/072; H01L 24/17; H01L 29/7803
(Continued)

(56) References Cited

U.S. PATENT DOCUMENTS 6,911,724 B1   6/2005  Sutardja
8,581,343 B1 * 11/2013  Desbiens ................ H01L 21/50
                                                257/341
(Continued)

FOREIGN PATENT DOCUMENTS

EP   0427142 A2   5/1991
FR   2786657 A1   6/2000

OTHER PUBLICATIONS

International Search Report and Written Opinion for PCT Patent App. No. PCT/EP2015/072540 (dated Jun. 1, 2016).

*Primary Examiner* — Nitin Parekh
(74) *Attorney, Agent, or Firm* — Kenealy Vaidya LLP

(57) ABSTRACT

Some embodiments relate to a semiconductor power device that includes a first substrate, a second substrate, a stack and an interconnect structure. The first substrate includes a first patterned electrically conductive layer on a first surface and a switching semiconductor element. The second substrate includes a second surface facing the first surface and a second patterned electrically conductive layer on the second surface. The stack includes an electrically conductive track and a layer of a dielectric material. The layer of the dielectric material is provided on the first or second patterned electrically conductive layer and the layer of the dielectric material
(Continued)

isolates the electrically conductive track from the patterned electrically conductive layer on which the stack is provided. The interconnect structure provides at least one electrical connection electrically conductive layers or areas of the substrates.

20 Claims, 4 Drawing Sheets

(51) Int. Cl.
*H01L 23/00* (2006.01)
*H01L 25/07* (2006.01)
*H01L 29/739* (2006.01)
*H01L 29/78* (2006.01)

(52) U.S. Cl.
CPC ............ H01L 24/17 (2013.01); H01L 25/072 (2013.01); *H01L 29/7393* (2013.01); *H01L 29/7802* (2013.01)

(58) Field of Classification Search
USPC .......................................................... 257/723
See application file for complete search history.

(56) References Cited

U.S. PATENT DOCUMENTS

| | | | | |
|---|---|---|---|---|
| 9,666,539 | B1* | 5/2017 | Li | H01L 21/4853 |
| 2002/0071293 | A1* | 6/2002 | Eden | H01L 23/4824 |
| | | | | 363/20 |
| 2004/0207968 | A1 | 10/2004 | Martin et al. | |
| 2007/0085187 | A1* | 4/2007 | Sun | H01L 23/3677 |
| | | | | 257/686 |
| 2008/0054439 | A1 | 3/2008 | Malhan et al. | |
| 2009/0283919 | A1* | 11/2009 | Tsui | H01L 23/4334 |
| | | | | 257/778 |
| 2010/0102327 | A1 | 4/2010 | Standing | |
| 2015/0364344 | A1* | 12/2015 | Yu | H01L 21/56 |
| | | | | 257/713 |
| 2018/0286814 | A1* | 10/2018 | Reynes | H01L 23/49811 |

* cited by examiner

SEMICONDUCTOR POWER DEVICE COMPRISING ADDITIONAL TRACKS AND METHOD OF MANUFACTURING THE SEMICONDUCTOR POWER DEVICE

CROSS REFERENCE TO RELATED APPLICATION(S)

This application is a National Phase Filing under 35 C.F.R. § 371 of and claims priority to PCT Patent Application No. PCT/EP2015/072540, filed on Sep. 30, 2015, the contents of which are hereby incorporated in its entirety by reference.

BACKGROUND

Some embodiments relate to semiconductor power devices and methods of manufacturing such devices, such as in the context of a power device capable of switching relatively high currents and/or at relatively high voltages. Such currents may be in the order of one to hundreds of Ampere and such voltages may be in the order of a few hundreds to thousands of Volts.

Published US patent application US2004/207968A1, which is incorporated herein by reference, discloses a power switching module that has several power switches. Each one of power switch includes a first substrate and a second substrate that both have several electrically conductive areas for conducting currents and providing signals on at least one of their surfaces. Insulated gate bipolar transistors are provided on the electrically conductive areas of the first substrate. One side of these transistors is a collector of the transistor and the collector is directly coupled to the electrically conductive areas of the first substrate. An opposite side of these transistors includes an emitter and a gate. Interconnect structures formed by electrically conductive cylinders are provided between emitters and gates, and specific electrically conductive areas of the second substrate.

As shown in FIG. 3 of the cited patent application and as described in its description, an electrically conductive area 64 of the second substrate 60, which is the electrically conductive area 64 to which the emitters are coupled, is relatively large because it has to conduct relatively large currents. However, because the gates have to receive a signal as well, separate electrically conductive areas (not numbered in FIG. 3 of the cited patent application) are manufactured inside the electrically conductive areas. The separate electrically conductive areas are isolated from the electrically conductive area 64 by means of a relatively large gap in between the electrically conductive areas. In practical embodiments, as a result of manufacturing characteristics, gaps are 1 millimeter wide—the layer in which the separate electrically conductive areas are present are relatively thick to be able to conduct high currents and, consequently, the gaps that have to be manufactured between electrically conductive area 64 and the separate electrically conductive area is relatively wide as well.

SUMMARY

This leads to a plurality of disadvantages. For example, the transistors have to be relatively large because a distance between the emitter and the gate has to be adapted to the size of the gap. Alternatively, a too small amount of the interconnect structures can be used between the emitter and the electrically conductive area 64 to which the emitter must be connected because the large gap is compensated by a portion of the emitter that is not provided with the interconnect structures. Less interconnect structures lead to too high resistances and may also lead to a too small conduction of heat towards the second substrate. A plurality of parasitic effects is obtained from the relatively wide gap and also the fact that the electrically conductive area 64 that is connected to the gate is surrounded by the electrically conductive area 64 that is connected to the emitter. Furthermore, inside the electrically conductive area 64, the current density may vary too much because the electrically conductive area 64 has locally a much smaller cross-sectional area. At least it can be concluded that the separate electrically conductive areas that are connected to the gate limits the maximum performance of the power switches.

Some embodiments therefore provide a semiconductor power device and method of manufacturing the same that addresses the issue(s) of the related art.

Some embodiments are directed to a semiconductor power device that includes a first substrate, a second substrate, a stack and an interconnect structure. The first substrate includes a switching semiconductor element and a first patterned electrically conductive layer. The first substrate has a first surface on which the first patterned electrically conductive layer is provided. The switching semiconductor element is provided on the first patterned electrically conductive layer. The second substrate includes a second patterned electrically conductive layer and a second surface facing the first surface. The second patterned electrically conductive layer is provided on the second surface. The stack includes an electrically conductive track and a layer of a dielectric material. The layer of the dielectric material is at least partly provided on the first patterned electrically conductive layer or on the second patterned electrically conductive layer and the layer of the dielectric material isolates the electrically conductive track from the patterned electrically conductive layer on which the stack is provided. The interconnect structure is for providing at least one electrical connection between the first patterned electrically conductive layer, a surface of the switching semiconductor element or the electrically conductive track at one side and the second patterned electrically conductive layer or the electrically conductive track at the other side.

The electrically conductive track is a separate track that is isolated from the patterned electrically conductive layer on which it is provided. Thus, a completely independent additional track/wire is provided which may carry low or medium current signals and, as such, the patterned electrically conductive layer may be enhanced or optimized for carrying high currents and does not need to be interrupted by tracks (and gaps between tracks) for carrying the low current signals. Completely independent means that a design of the first patterned electrically conductive layer or the second patterned electrically conductive layer is not any more influenced by a requirement to have wires which transport the relatively low current signals. This results in an advantage because the high current signals may be conducted by the patterned electrically conductive layer in a most optimal way such that the resistance is kept relatively low and the self-inductance is also relatively low. Furthermore, as seen in a direction parallel to the substrates, no gap is present between the electrically conductive track and the patterned electrically conductive layer on which the electrically conductive track is provided, and, thus, relatively small transistors may be used or a maximum area of the transistor may be used to connect any transistor terminal (e.g. a source, a drain, an emitter, or a collector) to the patterned electrically conductive layer either directly or by means of the interconnect structure. This also results in a lowered resistance and a lowered self-inductance. It also means that heat can be transported in an optimal way away from the transistor to the first substrate and to the second substrate. In other words, the semiconductor power device performs better and has a higher maximum performance.

Although the layer of the dielectric material must be thick enough to provide enough electrical isolation between the electrically conductive track and the first patterned electrically conductive layer or the second patterned electrically conductive layer, it is seen in practical embodiments that the layer of the dielectric material is still relatively thin as compared to the thickness of the substrates, the patterned electrically conductive layer, and the interconnect structure. Also, the electrically conductive track may be relatively thin because its intended use is to carry the low current signals. An additional height of the stack may be compensated by using, for example, interconnect elements in the interconnect structure that have an adapted smaller size for creating connections to the electrically conductive track. Thus, the thickness of the semiconductor power device is not increased as the result of the introduction of the stack of the electrically conductive track and the layer of the dielectric material.

The first patterned electrically conductive layer includes electrically conductive areas arranged in a specific first pattern. This means that there are one or more electrically separated electrically conductive areas that have a shape and a location that is defined by or relates to the overall design of the semiconductor power device. For example, a position and a structure of the switching semiconductor element define where the electrically conductive areas have to be designed to provide one or more current signals to the switching semiconductor element. This also applies to the second patterned electrically conductive layer in which the electrically conductive areas are arranged according to a specific second pattern. The stack including the electrically conductive track and the layer of the dielectric material is arranged according to a specific third pattern. In particular, the specific third pattern may include a pattern of elongated areas which defines the track. In general, the specific first pattern, the specific second pattern, and the specific third pattern are different patterns but have a strong relation with each other because they implement together with the switching semiconductor element, and an electrical circuit of the semiconductor power device.

In general, the electrically conductive track is suitable for conducting relatively small current signals for relatively longer periods of time, however, it is to be noted that during relatively shorter periods of time, medium sized current signals may be conducted by the electrically conductive track. For example, if the electrically conductive track conducts a current to or from a gate of the switching semiconductor element at a switching moment of the switching semiconductor element, the current may be 20 amperes during a few tenths of nanoseconds.

Optionally, the layer of the dielectric material has a thickness to obtain a dielectric breakdown voltage of at least 20 volts between the electrically conductive track and the patterned electrically conductive layer on which the stack is provided. Such dielectric breakdown voltage is useful when signals conducted by the electrically conductive track do not directly relate to the voltages/currents of the first patterned electrically conductive layer and/or the second patterned electrically conductive layer. For example, when the electrically conductive track carries a signal to control the gate of a transistor, this signal may deviate more than 20 volts from the voltages of the first patterned electrically conductive layer and/or the second patterned electrically conductive layer and, consequently, a reliable isolation must be provided.

Optionally, the semiconductor power device further includes an additional stack of an additional electrically conductive track and an additional layer of the dielectric material. The additional layer of the dielectric material is provided on the first patterned electrically conductive layer or the second patterned electrically conductive layer isolates the additional electrically conductive track from the patterned electrically conductive layer on which the additional stack is provided. Thus, the semiconductor power device may include one or more stacks of the electrically conductive track and the layer of the dielectric material. Also, the stacks may be provided on the first patterned electrically conductive layer or the second patterned electrically conductive layer or distributed over both patterned electrically conductive layers. It should also be noted that a plurality of switching semiconductor elements may be present in all embodiments of the semiconductor power device and these switching semiconductor elements may be coupled to either the first patterned electrically conductive layer or the second patterned electrically conductive layer, or a first set may be provided on the first patterned electrically conductive layer, and a second set may be provided on the second patterned electrically conductive layer.

Optionally, the dielectric material includes an epoxy, an oxide material (such as a silicon oxide), or a solder resist. The epoxy is a material that is easy to handle and can be applied easily on the first patterned electrically conductive layer or the second patterned electrically conductive layer. Furthermore, already relatively thin layers of the epoxy provide a high enough dielectric breakdown voltage, which is in particular advantageous if the dielectric breakdown voltage, needs to be larger than a well-defined minimum dielectric breakdown voltage. For example, a 0.6 micrometer thick layer of the epoxy can sustain more than 50 volts. Solder resist can easily be applied to the first patterned electrically conductive layer or the second patterned electrically conductive layer. Solder resist is used for stopping the SAC305 solder layer because the solder resist has a very bad wettability property so the solder layer is confined onto the metallization which has a good wettability instead. In the field of manufacturing electronic components and or electronic device, a lot of experience and technologies are available to apply such a layer of the solder resist to the first patterned electrically conductive layer or the second patterned electrically conductive layer. Also, these materials can withstand relatively high temperature for specific periods of time which is advantageous during an operation of the semiconductor power device because during the operation, the semiconductor power device may become relatively warm. Also, during the manufacturing of the semiconductor power device, relatively high temperatures may be used, for example, for sintering, these materials can also withstand these temperatures for a short period of time.

Optionally, the layer of the dielectric material includes two layers of the epoxy. It may be such that in one layer of the epoxy, there are some pinholes or other weak areas and providing two layers on top of each other leads to a more reliable layer of the dielectric material.

Optionally, the electrically conductive track includes a metal such as, a silver. Alternatively, the electrically conductive track includes an epoxy in which an amount of electrically conductive particles are provided to obtain an electrically conductive track and, optionally, the electrically conductive particles include silver particles. The presented materials can be applied relatively easily to the layer of the dielectric material by, for example, a sintering technology. Furthermore they have a high enough electrical conductivity and are, as such, suitable for carrying low current signals through the semiconductor power device. Optionally, the electrically conductive track includes solid porous silver. In particular, when the silver is sintered on the dielectric material, the material that is left after the sintering process is solid, porous, and contains silver.

Optionally, at least one of the first substrate and the second substrate include a ceramic support layer. The ceramic support layer provides strength to the substrate and is often heat conductive such that, heat can be transported away from the switching semiconductor element towards an outside surface of the semiconductor power device. Optionally, at a first surface of the ceramic support layer, the patterned electrically conductive layer is provided, and at a second opposite surface of the ceramic support layer, a metal layer is provided. The metal layer at the second opposite surface of the ceramic support layer may be patterned as well.

Optionally, the switching semiconductor element includes a transistor based on a wide band gap semiconductor material. Because of yield issues, transistors are often manufactured in a relatively small size, which means that a drain, an emitter, a source, or a collector of the transistors have to share a relatively small surface with a gate of the transistors and, as such, the drain, the emitter, the source, or the collector is also relatively small. Because the stack is applied to the first patterned electrically conductive layer or the second patterned electrically conductive layer, distances are reduced between contact areas or interconnect structures that connect to the gate and to at least one of the drain, the emitter, the source, or the collector (as seen in a direction parallel to the first substrate and/or the second substrate). Thus, a maximum number of the interconnect structures can be used, or a maximum contact area can be obtained. Therefore, an optimal electrical and thermal contact can be made to these transistors and the fact that they are relatively small in size, thus not anymore a specific disadvantage of such transistors. Optionally, the wide band gap semiconductor material includes silicon carbide (SiC), gallium nitride (GaN), or diamond.

Optionally, the electrically conductive track is electrically coupled to i) a gate or a base of the semiconductor switching device, ii) a sensor element that is embedded in the semiconductor power device, iii) an embedded driver element that is embedded in the semiconductor power device and/or iv) the first patterned electrically conductive layer or the second patterned electrically conductive layer at a specific sensing position where a voltage of the patterned electrically conductive layer must be sensed. A signal that must be provided to the gate or the base of the semiconductor switching device is, in general, a low current signal. The electrically conductive track is suitable for providing such signals. As discussed above, it also prevents that the first patterned electrically conductive layer and/or the second patterned electrically conductive layer has to include structures for carrying the signals for the gate and the base, and thus, the first patterned electrically conductive layer and/or the second patterned electrically conductive layer can be fully used for carrying the relatively high current signals to and from the drain, the emitter, the source, and/or the collector of the switching semiconductor element. Signals to sensor elements and/or embedded driver elements are, in general, low or medium current signals. If such signals are not carried through portions of the first patterned electrically conductive layer or the second patterned electrically conductive layer, then these first patterned electrically conductive layer or the second patterned electrically conductive layer can be optimally used for high currents as discussed previously. Advantages of this have been discussed previously.

It may also be such that the voltage of specific sensing position/location of the first patterned electrically conductive layer, or the second patterned electrically conductive layer must be known. If this is the case, the electrically conductive track may be coupled to the first patterned electrically conductive layer, or the second patterned electrically conductive layer at the specific sensing position/location. This may be done by providing a through hole through the layer of the dielectric material and filling the through hole with an electrically conductive material (optionally with the same material as the material of the electrically conductive track). This may also be done by providing an interconnect element of the interconnect structure between the electrically conductive track and the first patterned electrically conductive layer, or the second patterned electrically conductive layer at the specific sensing position/location. In particular, when the stack is provided on one of the first patterned electrically conductive layer, or the second patterned electrically conductive layer and the specific sensing position/location is on the other one of the first patterned electrically conductive layer, or the second patterned electrically conductive layer, the interconnect structure may be an effective and an efficient way to provide the electrical connection. It may also be such that, at the specific sensing position/location, the electrically conductive layer extends beyond the layer of the dielectric material and is also provided at the side surface of the layer of the dielectric material, and thereby, providing the electrical connection to the first patterned electrically conductive layer, or the second patterned electrically conductive layer. It is to be noted that, if the electrically conductive track has to be electrically coupled to the specific sensing position/location of the first patterned electrically conductive layer, or the second patterned electrically conductive layer, the dielectric breakdown voltage of the layer of the dielectric material can be kept relatively low, for example, a few volts. In such situations, a voltage difference between the signal of the electrically conductive track and the first patterned electrically conductive layer, or the second patterned electrically conductive layer is not larger than possible voltage differences within the first patterned electrically conductive layer, or the second patterned electrically conductive layer.

Another embodiment is directed to a method of manufacturing a semiconductor power device. The method includes i) obtaining a first substrate including a switching semiconductor element and a first patterned electrically conductive layer, the first substrate having a first surface on which the first patterned electrically conductive layer is provided, the switching semiconductor element being provided on the first patterned electrically conductive layer, ii) obtaining a second substrate including a second patterned electrically conductive layer and a second surface, the second patterned electrically conductive layer being provided on the second surface, iii) manufacturing a stack of an electrically conductive track and a layer of a dielectric material at least partly on the first patterned electrically conductive layer or the second patterned electrically conductive layer, the layer of the dielectric material isolates the electrically conductive track from the patterned electrically conductive layer on which the stack is manufactured, iv)

obtaining an interconnect element of an electrically conductive material, v) providing the interconnect element on one of the first patterned electrically conductive layer, the surface of the switching semiconductor element, the electrically conductive track or the second patterned electrically conductive layer, vi) assembling the second substrate opposite to the first substrate such that the first surface faces the second surface and such that at least one electrical connection is obtained between the first patterned electrically conductive layer, a surface of the switching semiconductor element or the electrically conductive track at one side and the second patterned electrically conductive layer or the electrically conductive track at the other side.

The above method is for manufacturing the semiconductor power device that has been discussed above. The method provides the same benefits and effects as the embodiments of the semiconductor power devices that has been discussed above.

Optionally, the manufacturing of the stack of the electrically conductive track and the layer of the dielectric material includes: providing a (patterned) layer of the dielectric material on the first patterned electrically conductive layer, or the second patterned electrically conductive layer, and providing the electrically conductive track on the (patterned) layer of the dielectric material.

Optionally, the providing of the (patterned) layer of the dielectric material includes providing a non-patterned layer of the dielectric material on the first surface or the second surface of the substrate on which the stack of the electrically conductive track, and the layer of a dielectric material has to be manufactured, providing a patterned etching protection layer on the non-patterned layer of the dielectric material, etching away the non-patterned layer of the dielectric material at locations where no patterned etching protection layer is present, and removing the patterned etching protection layer. This etching technique is cost effective and accurate for manufacturing a patterned layer of the dielectric material. Alternatively, printing methods may be used such as screen printing or traditional printing.

Optionally, the providing of the electrically conductive track on the (patterned) layer of the dielectric material includes providing a material to be sintered on the (patterned) layer of the dielectric material, optionally, the providing of the material to be sintered is provided with a screen printing technology, and sintering the substrate that includes the patterned electrically conductive layer on which the (patterned) layer of the dielectric material is provided to obtain the electrically conductive track. Such a sintering technique is effective and accurate for manufacturing the electrically conductive track. The material to be sintered includes particles of an electrical conductive material, such as metal particles (for example, silver particles) and some organic materials (for example, binders, dispersant, coating materials, etc.) Alternatively, other printing techniques are used for providing the material to be sintered on the patterned layer of the dielectric material.

BRIEF DESCRIPTION OF THE DRAWINGS

These and other aspects of some embodiments are apparent from and will be elucidated with reference to the embodiments described hereinafter. In the drawings, FIG. 1 schematically presents an exploded view of an embodiment of a semiconductor power device, FIG. 2 schematically presents a cross-sectional view of the embodiment of the semiconductor power device of FIG. 1 along line II-II', FIG. 3 schematically presents a cross-sectional view of another embodiment of the semiconductor power device, FIG. 4a schematically presents a top-view of a first substrate, FIG. 4b schematically presents a top-view of a second substrate to which the first substrate of FIG. 4a must be assembled, FIG. 4c schematically presents a side view of an assembled semiconductor power device that includes the first substrate and the second substrate of FIGS. 4a and 4b, respectively, and FIG. 5 schematically presents an embodiment of a method of manufacturing the semiconductor power device.

It should be noted that items which have the same reference numbers in different Figures, have the same structural features and the same functions, or are the same signals. Where the functions and/or structure of such items have been explained, there is no necessity for repeated explanation thereof in the detailed description.

DETAILED DESCRIPTION OF EXEMPLARY EMBODIMENTS

Figure 1:
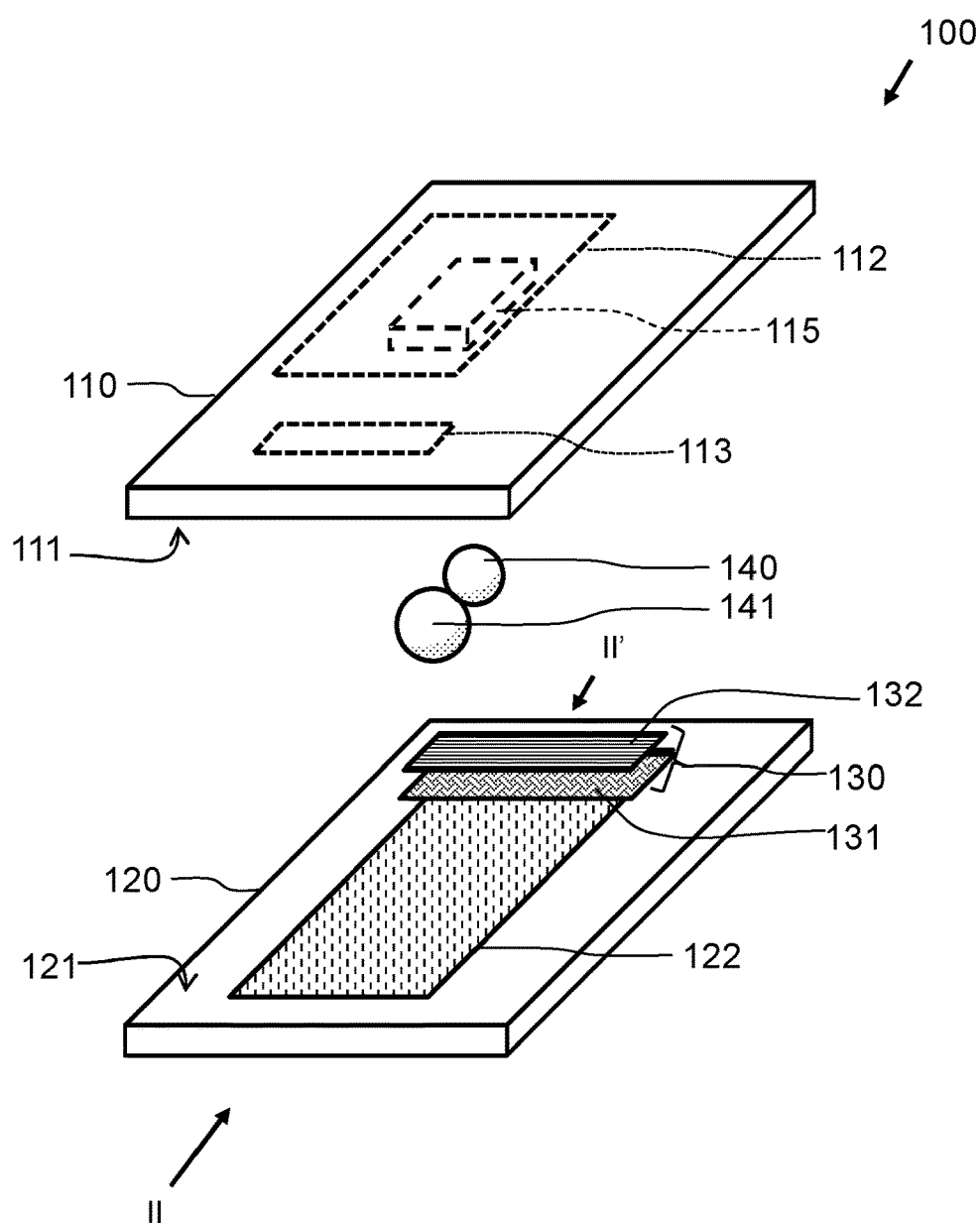

FIG. 1 schematically presents an exploded view of an embodiment of a semiconductor power device 100. The semiconductor power device 100 includes a first substrate 110, a second substrate 120, a stack 130, and an interconnect structure 140, 141.

The first substrate 110 includes a first surface 111 on which a first patterned electrically conductive layer 112, 113 is provided. The first substrate 110 also includes a switching semiconductor element 115 provided on a surface of the first patterned electrically conductive layer 112, 113. In particular, in the example of FIG. 1, the first patterned electrically conductive layer is formed by two separate electrically conductive areas 112, 113. The pattern of the first patterned electrically conductive layer is formed by shapes of the two separate electrically conductive areas 112, 113 and the location where the electrically conductive areas 112, 113 are provided on the first surface 111.

In the example, of FIG. 1, the switching semiconductor element 115 is, for example, a transistor. At least one of a drain, a source, an emitter, or a collector at a surface of the transistor is in contact with the first patterned electrically conductive layer 112, 113. The switching semiconductor element 115 has another surface, opposite to the surface that is coupled to the first patterned electrically conductive layer 112, 113. The another surface may have a gate of the transistor, and another one of the drain, the source, the emitter, or the collector of the transistor. It is to be noted that in practical embodiments, the gate and the emitter or source electrodes are at the same side of the transistor and the drain or collector are at the opposite side of the transistor. However, embodiments are not limited to this type of transistor. In the discussed embodiments also transistors with all electrodes at the same side may be used. In the discussed embodiments also transistors with the gate electrode at one side of the transistor and the other electrodes at the other opposite side of the transistor may be used.

Often, the electrically conductive areas 112, 113 are coupled to a specific voltage, or they have to conduct a current. However, it is not necessary that all electrically conductive areas 112, 113 are coupled to such voltages or have to conduct the current. An electrically conductive area 112, 113 of the first patterned electrically conductive layer may be unconnected have a floating voltage.

Figure 2:
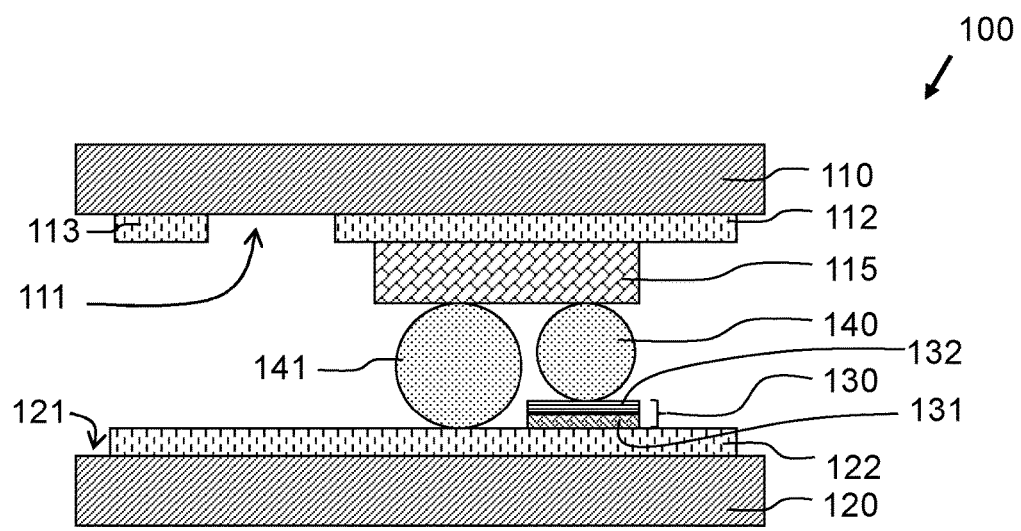

The second substrate 120 includes a second surface 121 which faces towards the first surface 111. The second substrate 120 includes a second patterned electrically conductive layer 122 which is provided on the second surface 121. In line with the above discussion, characteristics of the first patterned electrically conductive layer may also apply to the second patterned electrically conductive layer, for example, the second patterned electrically conductive layer 122 may include several electrically conductive areas. In FIG. 2, only a single electrically conductive area 122 forms the second patterned electrically conductive layer. The pattern of the second patterned electrically conductive layer is formed by the shape of the single electrically conductive area 122 and its location at the second surface 121.

The stack 130 includes an electrically conductive track 132, and a layer of dielectric material 131. The layer of the dielectric material 131 being at least partly provided on the first patterned electrically conductive layer 112, 113, or the second patterned electrically conductive layer 122. The layer of the dielectric material 131 isolates the electrically conductive track 132 from the patterned electrically conductive layer 112, 113, 122 on which the stack 130 is provided.

Optionally, the layer of the dielectric material 131 has at least a minimal thickness to obtain a dielectric breakdown voltage of at least 20 volts between the electrically conductive track 132 and the patterned electrically conductive layer on which the stack 130 is provided. Optionally, the layer of the dielectric material 131 has at least a minimal thickness to obtain a dielectric breakdown voltage of at least 30 volts between the electrically conductive track 132 and the patterned electrically conductive layer on which the stack 130 is provided. Optionally, the layer of the dielectric material 131 has at least a minimal thickness to obtain a dielectric breakdown voltage of at least 50 volts between the electrically conductive track 132, and the patterned electrically conductive layer on which the stack 130 is provided.

It should be noted that the stack 130 is partially provided on top of the electrically conductive area 122 of the second patterned electrically conductive layer and is partly in contact with the second surface 121. It is further to be noted that the term "track" in the electrically conductive track 132 suggests that the electrically conductive track has characteristics of a wire or a line. The electrically conductive track 132 has an elongated shape when its shape is projected on the second surface 121. Further, it should be noted that the layers 131, 132 of the stack 130 may have a specific shape and a specific position on at least one of the substrates. As such, the layers 131, 132 of the stack 130 may have patterned layers.

Optionally, the layer of the dielectric material 131 includes an epoxy, or an oxide material (which is often used as a passivation layer) or the dielectric material 131 is a solder resist. Examples of the oxide material such as, but is not limited to silicon oxide. It is known that the epoxy has a relatively good dielectric behavior which might be advantageous in certain cases. For example, according to a manufacturer of the epoxy, a 0.6 micrometer thick layer of the epoxy can sustain more than 50 volts. In another optional embodiment, the layer of the dielectric material 131 includes two layers of the epoxy. A layer of the epoxy may have, seen from the dielectric breakdown voltage point of view, some weak areas or even pin holes. By using two layers on top of each other, the amount of weak areas has been significantly reduced and the weak areas that are remaining are less weak.

Optionally, the electrically conductive track includes a metal such as, but is not limited to silver. Alternatively, the electrically conductive track is made of a layer of epoxy in which sufficient electrically conductive particles are dispersed such that the layer of epoxy become electrically conductive. These electrically conductive particles may be silver particles. In particular, metals with a high electrical conductivity are preferred. For example, the electrically conductive track includes copper, or silver. Optionally, the electrically conductive track includes solid porous silver. The solid porous silver may be a result of a sintering process. A material to be sintered may be provided on the layer of the dielectric material 131. Such a material to be sintered includes silver particles (for example, at least 85% percent) and other organic compounds which act as binders, dispersants, coatings, etc. Subsequently, the substrate 110, 120 on which the layer of the dielectric material 131 and the material to be sintered is provided, and is sintered at relatively low temperature (for example, lower than 300 degrees Celsius). The result is such that the other organic compounds are mostly burned away or evaporated, and the silver particles locally merge and thus, results in the solid porous silver. The solid porous silver has high melting point (in theory that of pure silver, 961 degrees Celsius) and is a good electrical conductor.

The interconnect structure provides at least one electrical connection between the first patterned electrically conductive layer 112, 113, a surface of the switching semiconductor element 115, or the electrically conductive track 132 at one side and the second patterned electrically conductive layer 122, or the electrically conductive track 132 at the other side. In fact, in the semiconductor power device 100 of FIG. 1, the interconnect structure includes two electrically conductive interconnect elements 140, 141. In the specific example of FIG. 1, the interconnect elements 140, 141 are spherical in shape. In an embodiment, other shapes are also possible. In another embodiment, the interconnect elements are formed by solder joints. An interconnect element 140 forms an electrical connection between a surface of the switching semiconductor element 115 and the electrically conductive track 132, and other interconnect element 141 forms an electrical connection between a surface of the switching semiconductor element 115 and the second patterned electrically conductive layer 122.

For example, as shown in FIG. 1, the interconnect element 140 connects to a gate of the switching semiconductor element 115 and the other interconnect element 141 connects to at least one of a drain, a source, an emitter, or a collector of the switching semiconductor element 115. As such, the electrically conductive track 132 conducts signals that are used to control the switching semiconductor element. These signals are, in general, low power signals and may conduct a medium sized current of a few tenths of amperes during a few tenths of milliseconds at moments in time when the switching semiconductor element 115 switches towards another conducting state.

In practical embodiments, the electrically conductive track 132 is directly or indirectly coupled to an external pin of the semiconductor power device 100. Also, the first and second electrically conductive layers 112, 113, 122 may be directly or indirectly coupled to external pins or other types of external connectors.

FIG. 2 schematically presents a cross-sectional view of the embodiment of the semiconductor power 100 device of FIG. 1 along line II-II'. In the cross sectional view, all elements discussed above can be seen. It is also seen that the interconnect elements 140, 141 are spaced apart to prevent a short-circuit between these two interconnect elements because they conduct different signals. It can also be seen in FIG. 2, that the two interconnect elements 140, 141 are relatively close to each other and, are as close as possible given the size of the interconnect elements 140, 141 and a safe distance between them to prevent a short-circuit. As compared to prior art embodiments, it is not required anymore to have a large gap between the interconnect elements 140, 141. As seen in a direction parallel to the second substrate 120, no gap is present between the electrically conductive track 132 and the second patterned electrically conductive layer 122. Therefore, it is not required to have a relatively large switching semiconductor element 115, or in a case, if the switching semiconductor element 115 is relatively large, then more interconnect elements can be provided to conduct signals, for example, relatively large current signals.

The switching semiconductor element 115 may be a transistor, a Field Effect Transistor (FET), a MOS Field Effect Transistor (MOSFET), a thyristor, an insulated-gate bipolar transistor (IGBT), a diode or another appropriate switching semiconductor element. The first substrate 110 and/or the second substrate 120 may further include other electronic elements including elements made up of a semiconductor material, such as, but not limited to silicon, silicon carbide, gallium arsenide, gallium nitride, diamond based semiconductor material, or other appropriate semiconductor materials. Examples of other appropriate semiconductor materials include, but not limited to resistors, capacitors, inductors, sensors, integrated circuits (for example, a driving circuitry), or other appropriate electronic elements.

When the switching semiconductor element 115 is a transistor, the switching semiconductor element 115 may include a wide band gap semiconductor material. Optionally, the wide band gap semiconductor material includes, but not limited to silicon carbide (SiC), gallium nitride (GaN) or diamond. In particular, the manufacturing process of the transistor of these materials has some yield issues when the transistors are relatively large and, therefore, relatively small transistors are preferred for such materials. As discussed above, the stack 130 enables the use of relatively small transistors.

The substrates 120, 130 may be manufactured of multiple layers of thermally conductive, electrically insulating materials (e.g. ceramics), and highly electrically conductive materials (e.g. metals) for the first and the second patterned electrically conductive layers and other routing. Examples of ceramics include, but are not limited to Aluminium Nitride (AlN), Aluminium Oxide (Al$_2$O$_3$), and Silicon Nitride (Si$_3$N$_4$). Another example of a substrate is Si$_3$N$_4$ which is sandwiched between two patterned metal layers, for example, patterned layers of copper or aluminium. Typically, in the relevant field, such substrates are termed as Direct Bonded Copper (DBC) substrates, or Active Metal Bonding/Brazing (AMB) substrates. Moreover. suitable substrates are described in a paper "Comparison of Silicon Nitride DBC and AMB Substrates for different applications in power electronics" of Manfred Goetz et al, pp 57-65, PCIM Europe conference, Nuremberg, 14-16 May 2013, published by VDE Verlag, Berlin. The article of Goetz et al is incorporated by a reference.

The first and second electrically conductive layers 112, 113, 122, and/or the interconnect elements 140, 141 may be made of metal such as, but not limited to, copper or aluminum, but also of other metals or other electrically conductive materials. Optionally, the material(s) of which the patterned electrically conductive layers 112, 113, 122 and/or the interconnect elements 140, 141 are made, is a good heat conductor such that the layers 112, 113, 122 and the interconnect elements 140, 141 contribute to the distribution and conduction of heat towards places where heat can be conducted away from the semiconductor power device 100 (for example, an interface to a heat sink).

In the example of FIG. 1 and FIG. 2, the electrically conductive track 132 of the stack 130 is electrically coupled to the gate of the switching semiconductor element 115. Embodiments of the current invention are not limited to such use of the electrically conductive track 132. In another embodiment, the semiconductor power device includes a sensor and the electrically conductive track is directly or indirectly coupled to the sensor. In another embodiment, the semiconductor power device includes an embedded driver element (a driver circuitry) and the electrically conductive track is coupled to the embedded driver element. Another use of the stack 130 is discussed in the context of FIG. 3.

In the example of FIG. 1 and FIG. 2 the stack 130 is partly provided on the second patterned electrically conductive layer and partly on the second surface. In other embodiments, the stack 130 is completely provided on the second patterned electrically conductive layer. In other embodiments, the stack 130 is partly or completely provided on the first patterned electrically conductive layer. In other embodiments, several stacks are present and the several stacks have the same properties, as stack 130 discussed above. These several stacks may be electrically isolated from each other and may also be directly or indirectly coupled to each other, for example, via electrical elements such as resistors, capacitors or inductances, or via, for example, an interconnect element of the interconnect structure. A number of these several stacks may be partly or completely provided on the first patterned electrically conductive layer 112, 113 and the other stacks may be partly or completely provided on the second patterned electrically conductive layer 122.

Figure 3:
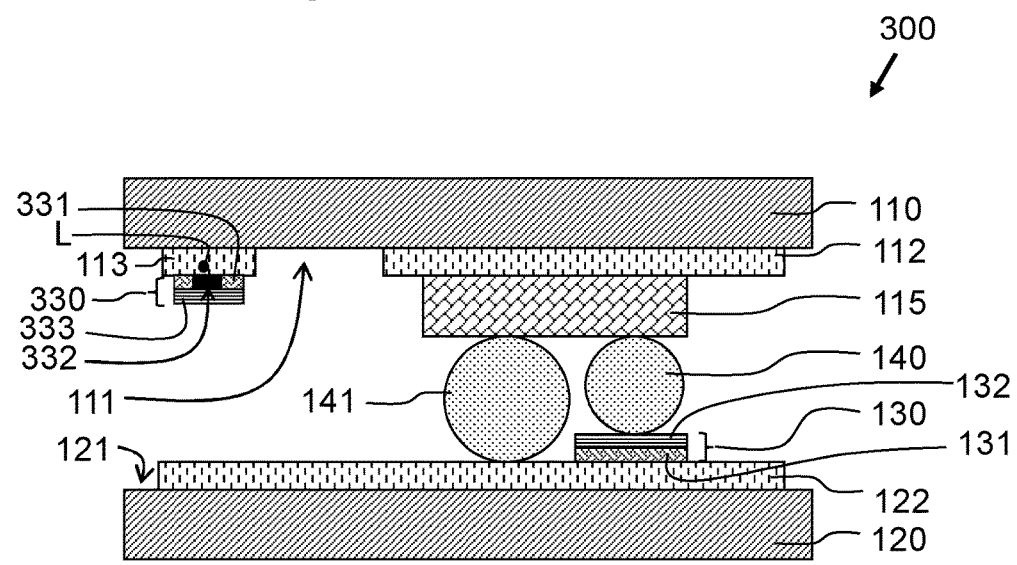

FIG. 3 schematically presents a cross-sectional view of another embodiment of a semiconductor power device 300. The semiconductor power device 300 is similar to the semiconductor power device 100 of FIG. 1 and FIG. 2 and has an additional stack 330 which includes an additional layer of a dielectric material 331 and an additional electrically conductive track 332. In an embodiment of the semiconductor power device 300, the additional electrically conductive track is electrically coupled to one of the electrically conductive areas 113 of the first patterned electrically conductive layers. At a specific sensing location L of the electrically conductive area, 113 the voltage must be sensed. For this purpose, the additional electrically conductive track is coupled to electrically conductive area 113 near the specific sensing location L. An electrical coupling is obtained via an electrically conductive material 332 that is provided in a through hole in the additional layer of the dielectric material 331. The electrically conductive material 332 may be a metal and may be the same material as the material of the additional electrically conductive track 332. Embodiments of such materials and of the characteristics of the additional layer of the dielectric material 331 and the additional electrically conductive track have been discussed in the context of FIG. 1 and FIG. 2. It is to be noted that the additional stack 330 is used to sense a voltage in electrically conductive area 113 but that embodiments of such additional stack 330 are not limited to this example only. The additional stack 330 may also be provided on electrically conductive area 112 for sensing a source or emitter voltage. The additional stack 330 may also be provided on the electrically conductive layer 122 for sensing the drain or collector voltage.

Figure 4A:
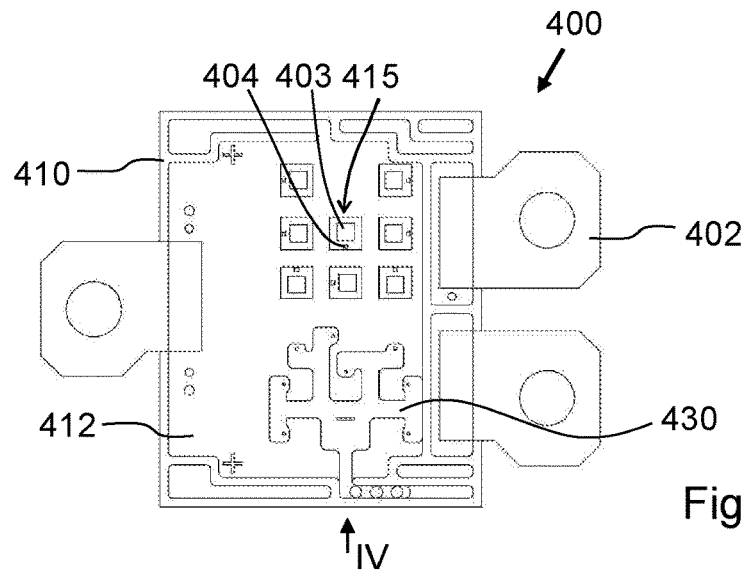

FIG. 4a schematically presents a top-view of a first substrate 400. The presented view follows viewing direction when a viewer is looking towards the first patterned electrically conductive layer 412. The first substrate 400 includes a ceramic support layer 410 on which the first patterned electrically conductive layer 412 is provided. The first patterned electrically conductive layer 412 is a copper layer. Three power connectors 402 are coupled to electrically conductive areas of the first patterned electrically conductive layer 412. On an electrically conductive area of the first patterned electrically conductive layer 412, eight transistors 415 are provided of which a gate electrode 404 and an emitter electrode 403 are shown. On top of the first patterned electrically conductive layer 412 is also provided a (patterned) stack 430 of an electrically conductive track (of which the surface is seen in FIG. 4a) and a dielectric layer that is interposed in between the electrically conductive track and the first patterned electrically conductive layer 412.

Figure 4B:
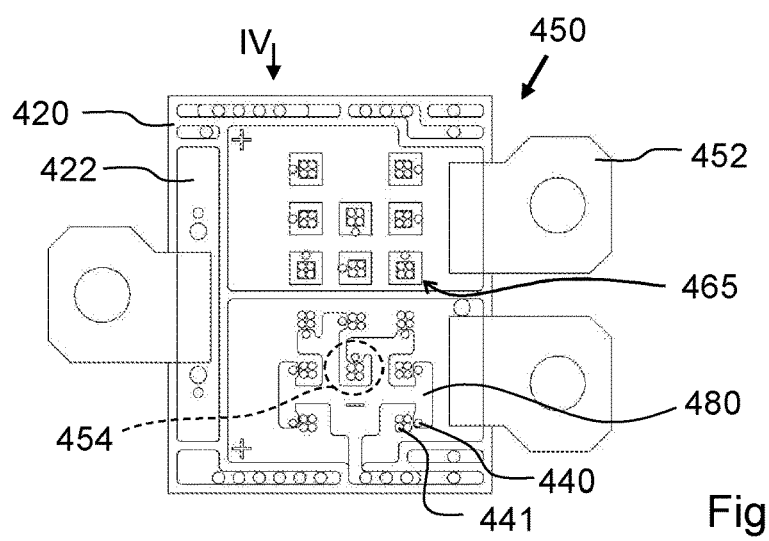

FIG. 4b schematically presents a top-view of a second substrate 450 to which the first substrate 400 of FIG. 4a must be assembled. The presented view follows viewing direction when a viewer is looking towards the second patterned electrically conductive layer 422. The second substrate 450 includes a ceramic support layer 420 on which a second patterned electrically conductive layer 422 of copper is provided. The second substrate 450 may also include three power connectors 452, or, in another embodiment, the power connectors 452 are absent. The optional power connectors 452 are coupled to the second patterned electrically conductive layer 422. Also, eight transistors 465 are provided on the second patterned electrically conductive layer 422. The second substrate 450 also includes a (patterned) stack 480 of an electrically conductive track (of which the surface is shown in FIG. 4b) and a dielectric layer that is interposed between the electrically conductive track and the second patterned electrically conductive layer 422. In FIG. 4b the second substrate 450 is already provided with interconnect elements, for example copper balls 440, 441 and a group of copper balls 454. A copper ball 440 is electrically coupled to the electrically conductive track of the stack 480 and is for providing a gate signal to one of the transistors of the first substrate 400. On the other hand, a copper ball 441 is electrically coupled to an area of the second patterned electrically conductive layer 422 and is for providing or receiving a current from an emitter of one of the transistors of the first substrate 400. When the first substrate 400 is to be assembled on the second substrate 450, the surface seen in FIG. 4a has to be arranged in such a position that it faces the surface of the second substrate 450 that is shown in FIG. 4b. Also, the groups of interconnect elements (e.g., the group of copper balls 454) is arranged directly opposite to the eight transistors 415 of FIG. 4a.

Figure 4C:
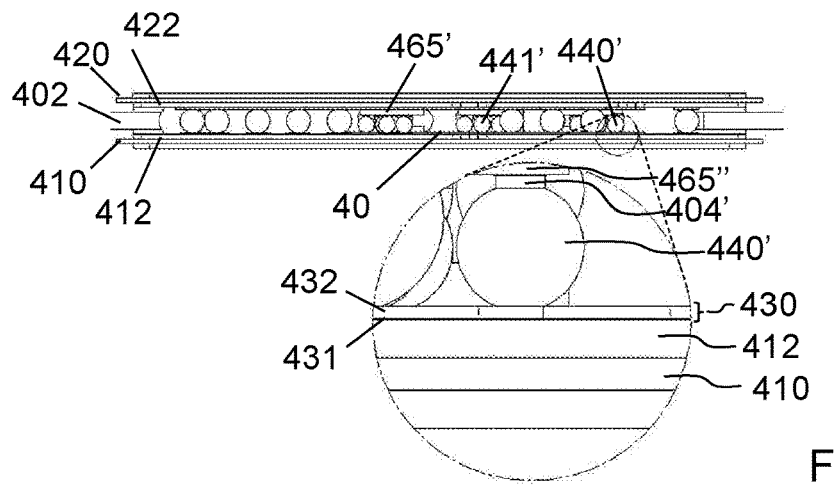

FIG. 4c schematically presents a side view of an assembled semiconductor power device that includes the first substrate 400 and the second substrate 450 of FIGS. 4a and 4b, respectively. In FIGS. 4a and 4b, an arrow is drawn which is indicated with IV. The arrows indicate which sides of the first substrate 400 and of the second substrate 450 is shown in FIG. 4c. A portion of the assembled semiconductor power device is enlarged at a bottom end of FIG. 4c. In FIG. 4c, the ceramic support layer 410, the first patterned electrically conductive layer 412, power connectors 402, the second patterned electrically conductive layer 422, the ceramic support layer 420, transistors 465' and 465", interconnect elements 440' and 441', and the stack 430 are shown. The transistors 465' and 465", an interconnect element 440', and an interconnect element 441' are similar to the eight transistors 465 of FIG. 4b and the interconnect elements 440, 441 of FIG. 4b, respectively. In an enlargement, it is shown that the stack 430 has an electrically conductive track 432 and a dielectric layer 431 that is interposed between the electrically conductive track 432 and the second patterned electrically conductive layer 422. In the enlargement, a gate contact 404' of the transistor 465" is also shown. The interconnect element 440' forms an electrical connection between the gate contact 404' and the electrically conductive track 432 of the stack 430.

It can be seen in FIGS. 4a to 4c that the interconnect elements 440, 440' can be placed very close to the interconnect elements 441, 441' and, thus, the gate electrode 404 of the transistors 415, 465, 465', 465" may be positioned close to the emitter 403 of the same transistors 415, 465, 465', 465" and/or several interconnect elements 441, 441' can be used to conduct a current to or from the emitter of the transistors 415, 465, 465', 465". Further, It can be seen in FIGS. 4a to 4c that the stack 430 and the stack 480 do not increase the total thickness of the semiconductor power device because a slight smaller copper ball may be used to form a connection to an opposite switching semiconductor element (e.g. the transistors 415, 465, 465', 465").

Embodiment of, alternatives for and more characteristics of element discussed in the context of FIGS. 4a, 4b and 4c can be found in the figure description of FIGS. 1 to 3. Effects and advantages of those elements have also been discussed in the context of FIGS. 1 to 3. FIGS. 4a to 4c present an embodiment of a semiconductor power device, but embodiments of the semiconductor power device are not limited to the details presented in FIGS. 4a to 4c. For example, the number of transistors may vary. Also, the patterns of the first patterned electrically conductive layer and the second patterned electrically conductive layer and of the stacks may differ. Also, the semiconductor power device may have fewer or more power connectors or external pins for receiving or providing low and/or medium current signals.

The above embodiments of the semiconductor power device may be provided in a package. A plurality of semiconductor power devices may be included in a single package for, for example, switching very high currents. Such a package may form, for example, a single or a three-phase power inverter for supplying power to an electrical motor. The packages may provide passive or active cooling. US Patent application US2004/0207968 discusses several details of the packages and the use of the semiconductor power device in specific circuitries. Another term for such a power inverter is a motor driver, in particular, when the power inverter is used to drive an electrical motor.

Figure 5:
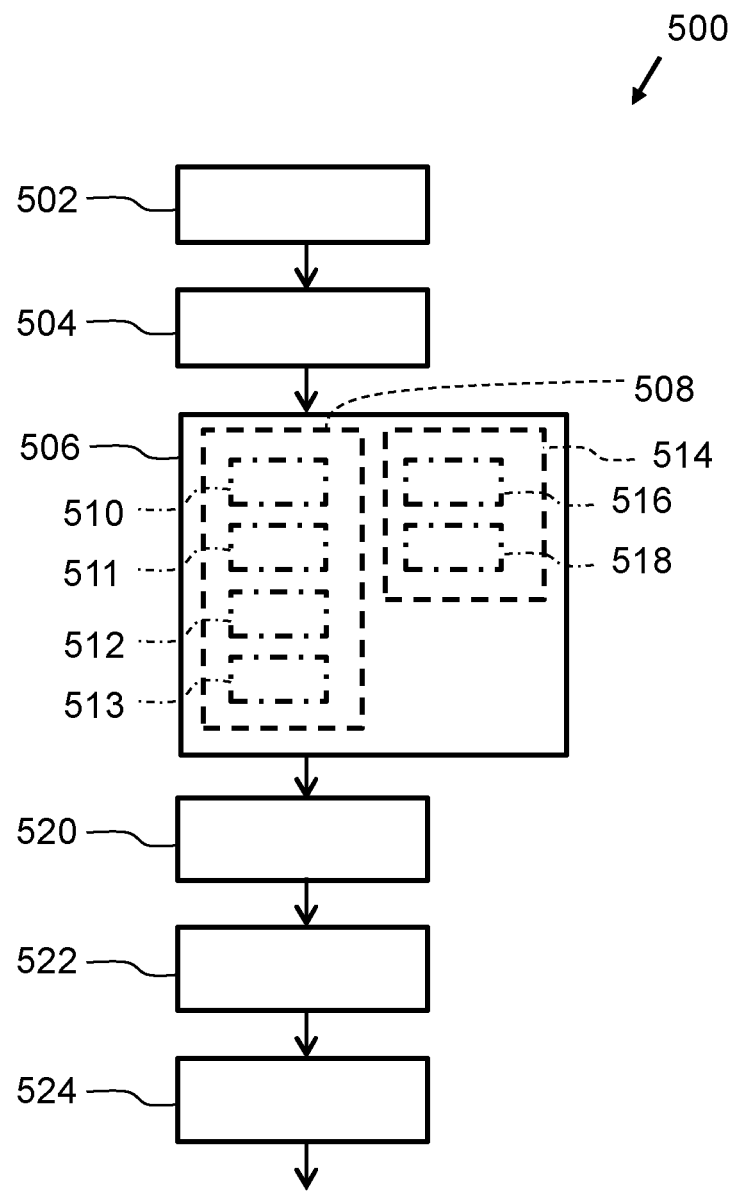

FIG. 5 schematically presents an embodiment of a method 500 of manufacturing a semiconductor power device. The method 500 includes a flow of: i) obtaining a first substrate at stage 502, including a switching semiconductor element and a first patterned electrically conductive layer, the first substrate having a first surface on which the first patterned electrically conductive layer is provided, the switching semiconductor element being provided on the first patterned electrically conductive layer, ii) obtaining a second substrate at stage 504, including a second patterned electrically conductive layer and a second surface, the second patterned electrically conductive layer being provided on the second surface, iii) manufacturing a stack at stage 506, of an electrically conductive track and a layer of a dielectric material at least partly on the first patterned electrically conductive layer or the second patterned electrically conductive layer, the layer of the dielectric material isolates the electrically conductive track from the patterned electrically conductive layer on which the stack is manufactured, iv) obtaining an interconnect element of an electrically conductive material at stage 520, v) providing the interconnect element at stage 522, on one of the first patterned electrically conductive layer, the surface of the switching semiconductor element, the electrically conductive track or the second patterned electrically conductive layer, vi) assembling the second substrate opposite to the first substrate at stage 524, such that the first surface faces the second surface and at least one electrical connection is obtained between the first patterned electrically conductive layer, a surface of the switching semiconductor element, or the electrically conductive track at one side and the second patterned electrically conductive layer or the electrically conductive track at the other side.

In FIG. 5, several stages are presented in a linear order, however, embodiments of the method 500 are not limited to such linear order. Several stages may be processed in parallel or may be processed in another order in so far they do not depend on each other. For example, the second substrate may be obtained before the first substrate. For example, if the stack has to be manufactured at least partly on the first patterned electrically conductive layer, the second substrate may also be obtained after manufacturing the stack.

Embodiments of several elements of the above method 500 that are obtained, manufactured, provided or assembled are discussed above.

The providing of the interconnect element on one of the first patterned electrically conductive layer, the surface of the switching semiconductor element, the electrically conductive track or the second patterned electrically conductive layer may include soldering the interconnect element to the respective layer or surface. The assembling the second substrate opposite to the first substrate at stage 524, may also include soldering the interconnect element to one of the first patterned electrically conductive layer, the surface of the switching semiconductor element, the electrically conductive track or the second patterned electrically conductive layer and may include other actions to fasten, for example, the first substrate to the second substrate thereby keeping a required gap between the first substrate and the second substrate.

Optionally, the manufacturing of the stack of the electrically conductive track and the layer of the dielectric material at stage 506 includes: providing a patterned layer of the dielectric material at stage 508, on the first patterned electrically conductive layer or the second patterned electrically conductive layer, and providing the electrically conductive track on the patterned layer of the dielectric material at stage 514. Optionally, the provided layer of the dielectric material is manufactured at a minimal thickness to obtain a minimum dielectric breakdown voltage of 20 volts between the electrically conductive track and the patterned electrically conductive layer on which the stack is manufactured.

Optionally, the providing of the patterned layer of the dielectric material at stage 508, includes providing a non-patterned layer of the dielectric material on the first surface or second surface of the substrate on which the stack of the electrically conductive track and the layer of a dielectric material has to be manufactured at stage 510, providing a patterned etching protection layer on the non-patterned layer of the dielectric material at stage 511, etching away the non-patterned layer of the dielectric material at locations where no patterned etching protection layer is present at stage 512, and removing the patterned etching protection layer at stage 513. This etching technique is cost effective and accurate for manufacturing a patterned layer of the dielectric material. Alternatively, printing methods may be used.

Optionally, the providing of the electrically conductive track at stage 514, on the patterned layer of the dielectric material includes providing a material to be sintered on the patterned layer of the dielectric material at stage 516, optionally, the providing of the material to be sintered is provided with a screen printing technology, and sintering the substrate at stage 518, that includes the patterned electrically conductive layer on which the patterned layer of the dielectric material is provided to obtain the electrically conductive track. Such a sintering technique is an effective and accurate for manufacturing the electrically conductive track. The material to be sintered includes particles of an electrical conductive material, such a metal particles (for example, silver particles) and some organic materials (for example, binders, dispersant, coating materials, etc.). Alternatively, other printing techniques are used for providing the material to be sintered on the patterned layer of the dielectric material.

It should be noted that the above-mentioned embodiments illustrate rather than limit the presently disclosed subject matter, and that those of ordinary skill in the art will be able to design many alternative embodiments.

In the claims, any reference signs placed between parentheses shall not be construed as limiting the claim. Use of the verb "include" and its conjugations does not exclude the presence of elements or steps other than those stated in a claim. The article "a" or "an" preceding an element does not exclude the presence of a plurality of such elements. Some embodiments may be implemented by means of hardware including several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A semiconductor power device comprising:
a first substrate including a first patterned electrically conductive layer, the first substrate having a first surface on which the first patterned electrically conductive layer is provided,
a second substrate including a second patterned electrically conductive layer and a second surface facing the first surface, the second patterned electrically conductive layer being provided on the second surface,
a switching semiconductor element arranged between the first patterned electrically conductive layer and the second patterned electrically conductive layer, the switching semiconductor element being provided on the first patterned electrically conductive layer,
a stack of an electrically conductive track and a layer of a dielectric material, the layer of the dielectric material being at least partly provided on the first patterned electrically conductive layer, or on the second patterned electrically conductive layer isolating the electrically conductive track from the patterned electrically conductive layer on which the stack is provided, the electrically conductive track being electrically coupled to a gate or a base of the switching semiconductor element for controlling the switching semiconductor element, and
an interconnect structure for providing at least a first electrically conductive interconnect element forming a first electrical connection between a surface of the switching semiconductor element and the second patterned electrically conductive layer, and a second electrically conductive interconnect element forming a second electrical connection
between opposing surfaces of the switching semiconductor element and the electrically conductive track, or
between opposing surfaces of the first patterned electrically conductive layer and the electrically conductive track.

2. The semiconductor power device according to claim 1, wherein the layer of the dielectric material has a dielectric breakdown voltage of at least 20 volts between the electrically conductive track and the patterned electrically conductive layer on which the stack is provided.

3. The semiconductor power device according to claim 2, further comprising an additional stack of an additional electrically conductive track and an additional layer of the dielectric material, the additional layer of the dielectric material being provided on the first patterned electrically conductive layer or the second patterned electrically conductive layer isolating the additional electrically conductive track from the patterned electrically conductive layer on which the additional stack is provided.

4. The semiconductor power device according to claim 1, further comprising an additional stack of an additional electrically conductive track and an additional layer of the dielectric material, the additional layer of the dielectric material being provided on the first patterned electrically conductive layer or the second patterned electrically conductive layer isolating the additional electrically conductive track from the patterned electrically conductive layer on which the additional stack is provided.

5. The semiconductor power device according to claim 1, wherein the dielectric material includes an epoxy, or an oxide material such as silicon oxide, or a solder resist.

6. The semiconductor power device according to claim 5, wherein the layer of the dielectric material includes two layers of the epoxy.

7. The semiconductor power device according to claim 1, wherein the electrically conductive track includes a metal such as silver, or the electrically conductive track includes an epoxy in which an amount of electrically conductive particles are provided to obtain a track that is electrically conductive and the electrically conductive particles include silver particles.

8. A semiconductor power device according to claim 1, wherein the electrically conductive track includes solid porous silver.

9. The semiconductor power device according to claim 1, wherein at least one of the first substrate and the second substrate include a ceramic support layer.

10. The semiconductor power device according to claim 1, wherein the switching semiconductor element includes a transistor based on a wide band gap semiconductor material.

11. The semiconductor power device according to claim 10, wherein the wide band gap semiconductor material includes SiC, GaN or diamond.

12. A semiconductor power device according to claim 1, wherein the electrically conductive track is further electrically coupled to at least one of:
a sensor element that is embedded in the semiconductor power device,
an embedded driver element that is embedded in the semiconductor power device, and the first patterned electrically conductive layer or the second patterned electrically conductive layer at a specific sensing position where a voltage of the respective patterned electrically conductive layer must be sensed.

13. A motor driver for providing power to an electrical motor, the motor driver comprising:
the semiconductor power device according to claim 1 for switching a current provided to the electrical motor.

14. The motor driver according to claim 13, wherein the motor driver is configured to provide a multi-phase electrical signal to the electrical motor, and wherein the motor driver includes at least one of the semiconductor power device according to claim 1 for each phase of the multi-phase electrical signal.

15. The semiconductor power device according to claim 1, wherein the interconnect structure is arranged for providing a third electrically conductive interconnect element forming a third electrical connection between a first surface of either the first patterned electrically conductive layer or the electrically conductive track of the stack provided on the first patterned electrically conductive layer, and a second surface opposing the first surface of either the second patterned electrically conductive layer or the electrically conductive track of the stack provided on the second patterned electrically conductive layer.

16. A method of manufacturing a semiconductor power device, the method comprising:
obtaining a first substrate comprising a switching semiconductor element and a first patterned electrically conductive layer, the first substrate having a first surface on which the first patterned electrically conductive layer is provided,
obtaining a second substrate comprising a second patterned electrically conductive layer and a second surface, the second patterned electrically conductive layer being provided on the second surface, the switching semiconductor element arranged between the first patterned electrically conductive layer and the second patterned electrically conductive layer and being provided on the first patterned electrically conductive layer,
manufacturing a stack of an electrically conductive track and a layer of a dielectric material at least partly on the first patterned electrically conductive layer or the second patterned electrically conductive layer, the layer of the dielectric material isolates the electrically conductive track from the patterned electrically conductive layer on which the stack is manufactured, the electrically conductive track being electrically coupled to a gate or a base of the switching semiconductor element for controlling the switching semiconductor element,
obtaining at least two interconnect elements made of an electrically conductive material,
providing the interconnect elements on one of the first patterned electrically conductive layer, the surface of the switching semiconductor element, the electrically conductive track or the second patterned electrically conductive layer, and
assembling the second substrate opposite to the first substrate such that the first surface faces the second surface and such that at least a first interconnect element forms a first electrical connection between opposing surfaces of the switching semiconductor element and the second patterned electrically conductive layer, and a second interconnect element forms a second electrical connection between opposing surfaces of the switching semiconductor element and the electrically conductive track, or between opposing surfaces of the first patterned electrically conductive layer and the electrically conductive track.

17. A semiconductor power device according to claim 16, wherein an interconnect structure is arranged for providing a third electrically conductive interconnect element forming a third electrical connection between a first surface of either the first patterned electrically conductive layer or the electrically conductive track of the stack provided on the first patterned electrically conductive layer, and a second surface opposing the first surface of either the second patterned electrically conductive layer or the electrically conductive track of the stack provided on the second patterned electrically conductive layer.

18. The method of manufacturing a semiconductor power device according to claim 16, wherein the manufacturing of the stack of the electrically conductive track and the layer of a dielectric material comprises:

providing a patterned layer of the dielectric material on the first patterned electrically conductive layer or the second patterned electrically conductive layer, and providing the electrically conductive track on the patterned layer of the dielectric material.

19. The method of manufacturing a semiconductor power device according to claim 18, wherein the providing of the patterned layer of the dielectric material comprises:

providing a non-patterned layer of the dielectric material on the first surface or the second surface of the first substrate or the second substrate on which the stack of the electrically conductive track and the layer of a dielectric material has to be manufactured, providing a patterned etching protection layer on the non-patterned layer of the dielectric material, etching away the non-patterned layer of the dielectric material at locations where no the patterned etching protection layer is present, and removing the patterned etching protection layer.

20. A method of manufacturing a semiconductor power device according to claim 18, wherein the providing of the electrically conductive track on the patterned layer of the dielectric material comprises:

providing a material to be sintered on the patterned layer of the dielectric material, optionally, the providing of the material to be sintered is provided with screen printing, sintering the first substrate or the second substrate that comprises the patterned electrically conductive layer on which the patterned layer of the dielectric material is provided to obtain the electrically conductive track.

* * * * *